July 22, 1958 R. E. YAEGER 2,844,667

CASCADE TRANSISTOR AMPLIFIERS

Filed Feb. 11, 1954

INVENTOR
R. E. YAEGER
BY N. S. Ewing
ATTORNEY

United States Patent Office 2,844,667
Patented July 22, 1958

2,844,667

CASCADE TRANSISTOR AMPLIFIERS

Robert E. Yaeger, Bedminster, N. J., assignor to Bell Telephone Laboratories, Incorporated, New York, N. Y., a corporation of New York Application February 11, 1954, Serial No. 409,684

8 Claims. (Cl. 179—171)

This invention relates to cascade transistor amplifiers, and its principal object is to simplify the biasing of transistor amplifiers utilizing two or more transistors of the same conductivity type.

Another and more particular object is to bias a pair of transistor amplifier stages of unlike circuit configuration in as simple and economical a manner as possible.

Still another object is to provide a constant emitter-current bias for a pair of amplifier stages of unlike circuit configurations in as simple a manner as possible.

When strict system requirements as to gain, input and output impedance, and band width are encountered, a two-stage transistor amplifier having a first stage of the common-collector configuration (sometimes called grounded-collector) and a second stage of the common-emitter configuration (sometimes called grounded-emitter) is a useful circuit arrangement. Such an amplifier has high gain, has good impedance matching between stages, and provides a phase reversal between its input and output terminals, making possible the ready application of over-all negative feedback. In order that both may have substantially the same electrical characteristics, e. g., with respect to alpha cut-off, it is often desirable that both transistors be of the same conductivity type. Biasing, however, presents difficulties because of the different circuit configurations of the two stages. Corresponding electrodes of the two transistors, for example, require different biasing potentials and cannot merely be connected to the same direct voltage sources. As a result, it is often necessary either to bias each stage separately or to accept additional circuit complications and loss of power in biasing them simultaneously.

In accordance with a principal feature of the invention, a two-stage transistor amplifier in which the first stage is of the common-collector configuration and the second is of the common-emitter configuration is provided with direct coupling between the emitter electrode of the first stage and the base electrode of the second, and both transistors are biased from the same sources of direct potential. One source of direct potential is connected to bias the collector electrode of the first transistor in the reverse direction, another is connected to bias the emitter electrode of the second transistor in the forward direction, and both cooperate to bias the emitter electrode of the first transistor in the forward direction and to bias the collector electrode of the second transistor in the reverse direction.

In accordance with another feature of the invention, both transistors of the two-stage amplifier are provided with a substantially constant emitter-current bias from the same sources of direct potential at the same time that power losses in the interstage connections are minimized. The direct coupling between the emitter electrode of the first stage and the base electrode of the second permits the emitter electrodes of both transistors to be coupled to the same source of direct potential through series resistances, with no additional connection to the base electrode of the second stage required. The operating points of both transistors are thereby stabilized against changes which might otherwise be caused by temperature variations and unit-to-unit variation in collector current for zero emitter current without necessitating individual biasing connections for each stage.

In accordance with still another feature of the invention, the signal output path of the final stage of the two-stage transistor amplifier is decoupled from the sources of direct biasing potential without the loss of any power beyond that already used for biasing the two transistors. The series resistance between the emitter electrode of the second transistor and the appropriate source of direct biasing potential is bypassed in order to avoid local gain-reducing feedback. Extending this bypass condenser to ground permits it to serve also to decouple the signal output path from the biasing source.

A more complete understanding of the various features of the invention may be secured by a study of the following detailed description of several specific embodiments. In the drawings.

Figure 1:
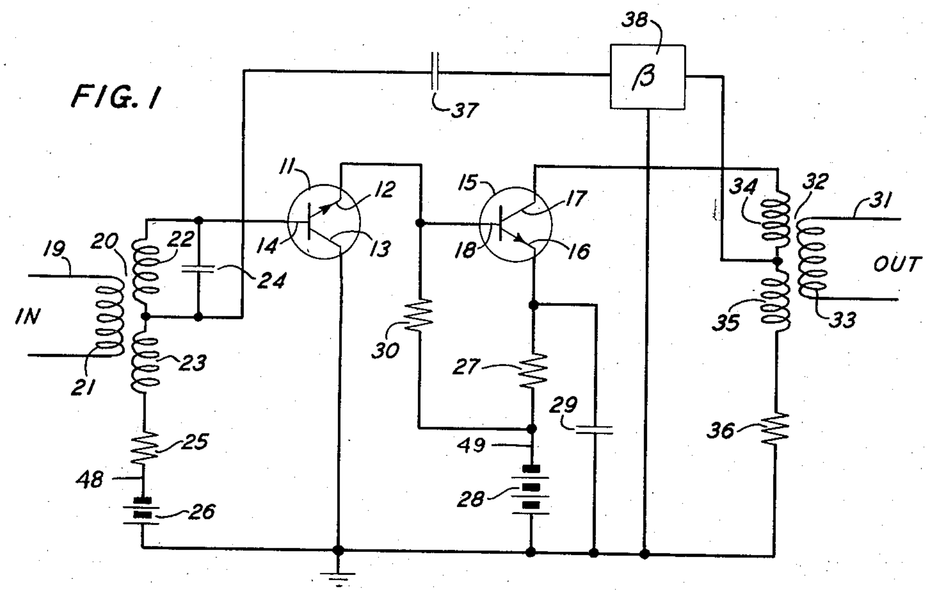
Fig. 1 is a schematic diagram of a two-stage transistor amplifier embodying the invention which makes use of a negative feedback path with so-called high-side hybrid-coil connections at both its input and its output ends.

The embodiment of the invention illustrated in Fig. 1 is a two-stage transistor amplifier particularly suited for supplying either carrier or voice frequency amplification, depending upon the circuit constants, in a carrier telephone system. The circuit shown includes a first transistor 11 which has a semiconductive body and an emitter electrode 12, a collector electrode 13, and a base electrode 14, and a second transistor 15 which also has a semiconductive body and an emitter electrode 16, a collector electrode 17, and a base electrode 18. Both transistors 11 and 15 are of the same conductivity type. In the conventional transistor symbols shown, the emitter arrows point outward, indicating a direction of positive emitter-current flow out of the transistors. The invention is not, however, limited to any particular type of transistor, and both transistors may be replaced, if desired, by transistors of the opposite conductivity type. If so, the polarities of all biasing sources should be reversed from those shown. If only one transistor is replaced by a transistor of the opposite conductivity type, biasing connections should be made so that the emitter electrodes of both transistors are still biased in the forward direction and the collector electrodes of both transistors are still biased in the reverse direction.

In Fig. 1, the incoming transmission line 19 is coupled to the first stage of the amplifier by a hybrid coil or three-winding transformer 20. One winding 21 of hybrid coil 20 is connected across the end of line 19, and the others 22 and 23 are connected in series in the signal input path of the first stage of the transistor amplifier. A condenser 24, the purpose of which will be noted later, is connected in parallel with winding 22, the nearer of the two windings to the base electrode 14 of transistor 11.

The first transistor 11 is connected to form a stage of the common-collector configuration (so-called because the collector electrode is common to both the signal input and signal output paths of the stage). Collector electrode 13 is grounded, base electrode 14 is connected directly to one side of winding 22, and winding 23 is connected through a resistor 25 to a direct negative potential, conventionally represented by a battery 26. In the language of the rectifier art, this negative potential serves to bias the collector electrode 13 of transistor 11 in the reverse direction.

The second transistor 15 is connected to form a stage of the common-emitter configuration (so-called because the emitter electrode is common to both the signal input and the signal output paths of the stage). The emitter electrode 12 of transistor 11 is connected directly to base electrode 18 of transistor 15, while emitter electrode 16 of transistor 15 is connected through a large resistor 27 to a direct negative potential, conventionally represented by a battery 28. A bypass condenser 29 is connected between emitter electrode 16 and ground to prevent local feedback from reducing the gain of the second stage. A large resistor 30 is connected between emitter electrode 12 of transistor 11 and the negative potential represented by battery 28. This last negative potential serves to bias the emitter electrode 16 of transistor 15 in the forward direction.

On the output side of transistor 15, an outgoing transmission line 31 is coupled to collector electrode 17 through a second hybrid coil or three-winding transformer 32. One winding 33 of hybrid coil 32 is connected across the end of line 31, and the other two, 34 and 35, are connected in series in the signal output path of the second stage of the amplifier. One side of winding 34 is connected to collector electrode 17, and the correspondingly opposite side of winding 35 is returned to ground through a resistor 36.

The connections which have been enumerated form both a signal input path and a D.-C. path between the base electrode 14 and the collector electrode 13 of the first transistor 11. Likewise, they form both a signal output path and a D.-C. path between the collector electrode 17 and the emitter electrode 16 of the second transistor 15. The interstage network between the two transistors includes a direct connection between the emitter electrode 12 of transistor 11 and the base electrode 18 of transistor 15 and a D.-C. connection between the collector electrode 13 of transistor 11 and the emitter electrode 16 of transistor 15. In the collector-base path of the first stage, resistor 25 and voltage source 26 may, if desired, be bypassed to ground.

The two-stage transistor amplifier in Fig. 1 is particularly advantageous for use in a carrier telephone system in a number of respects. In the first place, since the common-emitter stage provides a phase reversal and the common-collector stage does not, there is one net phase reversal between the input and output sides of the amplifier. This makes possible the ready application of over-all negative feedback without any necessity of using a phase-reversing transformer. In Fig. 1, this negative feedback is provided by a coupling capacitor 37 and a generalized feedback network 38 connected substantially in series from the mid-point between windings 22 and 23 of hybrid coil 20 to the mid-point between windings 34 and 35 of hybrid coil 32. Any ground connection needed in feedback network 38 may be made directly, as shown in Fig. 1.

Other advantages of the circuit shown in Fig. 1 include high gain and good impedance matching between the two stages of amplification. Both the common-emitter and the common-collector stages yield more gain than would be obtainable from comparable stages of the common-base configuration. In addition, the output impedance of the common-collector stage is low and substantially matches the low input impedance of the common-emitter stage. The input impedance of the common-collector stage and the output impedance of the common-emitter stage are both high, facilitating the use of the illustrated hybrid-coil feedback arrangement. Hybrid-coil feedback, in turn, minimizes the loss and the reducing or increasing effects on over-all input and output impedances which might otherwise be encountered in the stabilization by feedback of gain and band width. Condenser 24, connected across winding 22 on the input side of the first stage, serves further to control the frequency characteristic of the feedback to the base electrode 14 of transistor 11.

In accordance with a principal feature of the invention, these advantages of a circuit of the general configuration shown in Fig. 1 are obtained with a minimum of circuit complication due to biasing. In the embodiment shown, both transistors 11 and 15 are biased from the same direct voltages 26 and 28. The magnitude of voltage 28 is greater than that of voltage 26. Voltage 26 operates in the D.-C. path between base electrode 14 and collector electrode 13 to bias the latter electrode in the so-called reverse direction, which is the correct bias to secure gain from transistor 11. The emitter current in transistor 11 is essentially determined by the current in resistor 30. The net D.-C. voltage forcing current through the internal base-emitter path of transistor 11 and through resistor 30 is the difference between the magnitudes of voltages 26 and 28. Since voltage 28 is greater than voltage 26, the resultant difference forces current through emitter 12 in the direction of the arrow and thus biases it in the so-called forward direction. The emitter current in transistor 15 is determined in much the same manner. The net D.-C. forcing voltage is, as before, the difference between voltages 26 and 28, but the current here is that which flows through resistor 27. The direction of current flow is such that emitter electrode 16 is biased in the forward direction. The direct voltage at the base electrode 18 of transistor 15 is substantially the same as that at the base electrode 14 of transistor 11, with the result that collector electrode 17 is more positive than base electrode 18 by an amount substantially equal to direct voltage 26. Collector electrode 17 is thus biased in the reverse direction not only by voltage 26 but, in a larger sense, by the combined actions of voltages 26 and 28, since the latter voltage cooperates with resistors 27 and 30 to maintain substantially constant emitter currents and hence substantially constant collector currents in both transistors.

In this manner, the present invention permits both transistors of the two-stage amplifier to be biased from the same direct voltages even though the transistors are both of the same conductivity type and the two stages are of unlike circuit configuration. It affords economy and uniformity of biasing and, furthermore, minimizes the number of circuit elements required, since it permits the simple interstage coupling network shown to be used.

Another important feature of the invention embodied by the transistor amplifier illustrated in Fig. 1 is the arrangement for providing substantially constant emitter-current bias for both stages. This feature is, in a sense, an application to a two-stage amplifier of the constant emitter-current biasing arrangement forming the basis for applicant's copending application Serial No. 246,823, filed September 15, 1951 (United States Patent 2,680,160, issued June 1, 1954). The resistances of resistors 27 and 30 are large in comparison with the other resistances in the respective D.-C. emitter biasing paths. As a result, the emitter bias of each transistor tends to decrease whenever emitter current increases and to increase whenever emitter current decreases. The emitter biasing current thus tends to remain substantially constant in each transistor regardless of temperature changes or of unit-to-unit variations in $I_{co}$, the collector current which flows for zero emitter current. The present invention particularly features the direct coupling between the emitter electrode of the common-collector stage and the base electrode of the common-emitter stage which permits this constant emitter current biasing of both stages from the same direct potential sources without requiring any additional interstage elements. Capacitive coupling between stages would, for example, require that a resistor be connected between base electrode 18 and direct voltage 26, decreasing the shunt interstage resistance and increasing the interstage loss.

Still another feature of the embodiment of the invention illustrated in Fig. 1 is the arrangement by which the bypass condenser 29 associated with the constant emitter-current biasing means for the second stage serves also to decouple the amplifier signal output path from biasing potential 28. By connecting bypass condenser 29 to ground rather than merely to negative potential 28, condenser 29 is made not only to prevent local feedback from decreasing the gain of the second stage but also to decouple the signal output path from biasing potential 28. No power in addition to that used for biasing is, however, lost due to this second function.

By way of example, the following values for the circuit elements in Fig. 1 are given as typical for amplifiers operative in the carrier frequency and in the voice frequency range, respectively.

Carrier frequency:

| | |
|---|---|
| Transistor **11** | 1858 type (n-p-n). |
| Transistor **15** | 1858 type (n-p-n). |
| Hybrid coil **20** | 600:5000+500 impedance ratio (windings **21**, **22**, and **23**, respectively). |
| Condenser **24** | 120 micromicrofarads. |
| Resistor **25** | 500 ohms. |
| Direct voltage **26** | −15 volts. |
| Resistor **27** | 1500 ohms. |
| Direct voltage **28** | −20 volts. |
| Condenser **29** | 1 microfarad. |
| Resistor **30** | 5000 ohms. |
| Hybrid coil **31** | 600:5000+500 impedance ratio (windings **33**, **34**, and **35**, respectively). |
| Resistor **36** | 500 ohms. |
| Condenser **37** | 1 microfarad. |

Voice frequency:

| | |
|---|---|
| Transistor **11** | 1858 type (n-p-n). |
| Transistor **15** | 1858 type (n-p-n). |
| Hybrid coil **20** | 600:20,000+500 impedance ratio (windings **21**, **22**, and **23**, respectively). |
| Condenser **24** | 240 micromicrofarads. |
| Resistor **25** | 500 ohms. |
| Direct voltage **26** | −15 volts. |
| Resistor **27** | 1500 ohms. |
| Direct voltage **28** | −20 volts. |
| Condenser **29** | 25 microfarads. |
| Resistor **30** | 5000 ohms. |
| Hybrid coil **31** | 600:5000+500 impedance ratio (windings **33**, **34**, and **35**, respectively). |
| Resistor **36** | 500 ohms. |
| Condenser **37** | 4 microfarads. |

Figure 2:
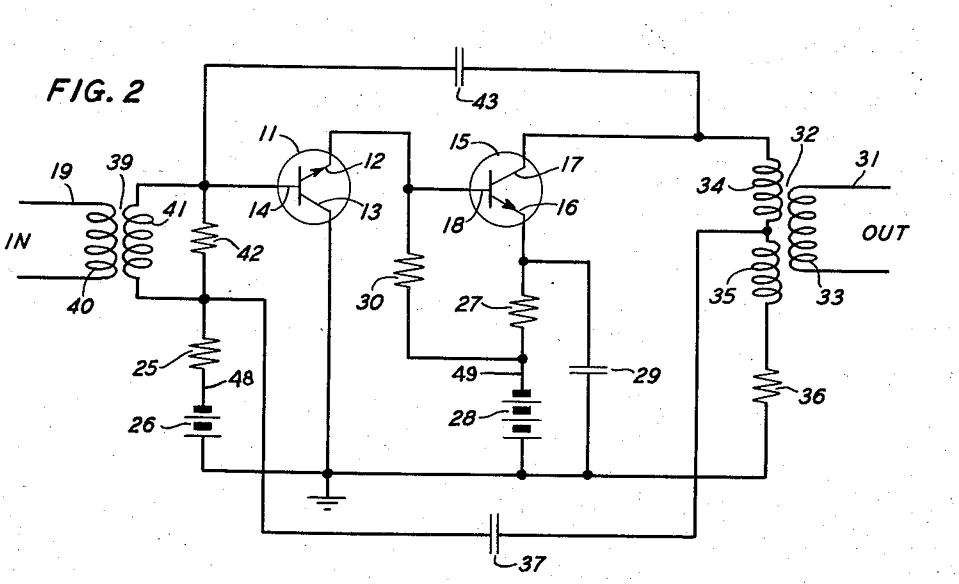
Fig. 2 is a variation of the embodiment of the invention shown in Fig. 1 in which the negative feedback path is from a high-side hybrid-coil connection at the output end to a series type connection at the input end.

The embodiment of the invention illustrated in Fig. 2 is particularly suitable for voice frequency applications and is a variation of the circuit of Fig. 1 in which the feedback connection at the output side of the amplifier is of the so-called high-side hybrid-coil type, while that at the input end is of the so-called series type. The basic circuit configuration, however, is the same as in Fig. 1.

A principal difference between the circuits of Figs. 1 and 2 is that in the latter the input transmission line 19 is coupled to the base electrode of the first stage of the transistor amplifier by a two-winding transformer 39. The primary winding 40 of transformer 39 is connected across the end of line 19, while the secondary 41 is connected in parallel with a resistor 42 between the base electrode 14 of transistor 11 and the side of resistor 25 farthest removed from direct potential source 26. No feedback network 38 is provided as in Fig. 1, and the common point between windings 34 and 35 in hybrid coil 32 is coupled through feedback capacitor 37 to the common point between resistors 25 and 42. A condenser 43, which is connected between base electrode 14 of transistor 11 and collector electrode 17 of transistor 15, serves much the same purpose as condenser 24 in Fig. 1 in shaping the feedback-frequency characteristic of the amplifier.

By way of example, the following values for the circuit elements in Fig. 2 are given as typical for amplifiers operative in the voice frequency range.

| | |
|---|---|
| Transistor **11** | 1858 type (n-p-n). |
| Transistor **15** | 1858 type (n-p-n). |
| Resistor **25** | 1500 ohms. |
| Direct voltage **26** | −15 volts. |
| Resistor **27** | 1500 ohms. |
| Direct voltage **28** | −20 volts. |
| Condenser **29** | 25 microfarads. |
| Resistor **30** | 5000 ohms. |
| Hybrid coil **32** | 600:5000+500 impedance ratio (windings **33**, **34**, and **35**, respectively). |
| Resistor **36** | 5000 ohms. |
| Condenser **37** | 5 micromicrofarads. |
| Transformer **39** | 5000:10,000 impedance ratio (windings **40** and **41**, respectively). |
| Resistor **42** | 10,000 ohms. |
| Condenser **43** | 1 microfarad. |

Still other variations of the basic circuit configuration illustrated in Figs. 1 and 2 are, of course, possible. Another feedback arrangement which is useful under some circumstances is from a hybrid coil at the output side of the two-stage amplifier to a shunt connection at the input side.

Figure 3:
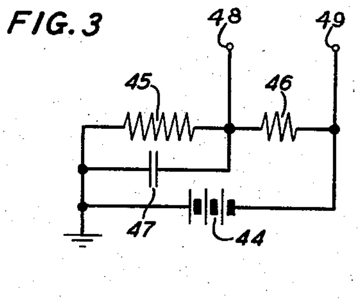
Fig. 3 is a schematic diagram of a specific power supply connection which may be used in the embodiments of the invention shown in Figs. 1 and 2.

Fig. 3 illustrates a specific direct voltage supply source which may be used in the embodiments of the invention shown in Figs. 1 and 2. A single source of direct potential 44 is used. The positive terminal of source 44 is grounded, and the negative terminal is used to supply the direct voltage indicated in Figs. 1 and 2 by battery 28 by way of a terminal connection 49. A potentiometer including a pair of series resistors 45 and 46 is connected across source 44, and a tap between the two resistors provides the direct voltage indicated in Figs. 1 and 2 by battery 26 by way of a terminal connection 48. A bypass condenser 47 is shunted across resistor 45. By way of example, the values for the elements shown in Fig. 3 may be as follows:

| | | |
|---|---|---|
| Direct voltage source **44** | volts | 20 |
| Resistor **45** | ohms | 9000 |
| Resistor **46** | do | 3000 |

In Figs. 1 and 2, the two direct voltages have been conventionally shown as separate batteries in order to make clear the basic nature of the various circuit connections. In practice, however, some such arrangement as that shown in Fig. 3 is more likely to be used. As indicated by reference numerals 48 and 49 in Figs. 1 and 2, terminals 48 and 49 in Fig. 3 are connected, respectively, to the junction between resistor 25 and voltage source 26 and the junction between resistor 27 and voltage source 28.

In considering the embodiments of the invention illustrated in Figs. 1 and 2, it is convenient in many respects to regard voltages 26 and 28 as being two separate voltage sources. It is intended, however, that such a description is also applicable to the circuits when the arrangement shown in Fig. 3 is used. The resistor 45 may be regarded as the "source" of the voltage appearing at terminal 48, while the series combination of resistors 45 and 46 may be regarded as the "source" of the voltage appearing at terminal 49.

Still another arrangement by which biasing potentials may be supplied to the two stages of amplification in Figs. 1 and 2 comprises a single battery with an intermediate tap. Thus, voltage 26 would be a tap on voltage 28. In such an arrangement, so much of the battery as represents voltage 26 can be regarded as one "source" and the entire battery, representing voltage 28, as the other.

It is to be understood that the above-described arrangements are illustrative of the application of the principles of the invention. Numerous other arrangements may be devised by those skilled in the art without departing from the spirit and scope of the invention.

What is claimed is:

1. A cascade amplifier which comprises first and second transistors of like conductivity type each having a semiconductive body and an emitter electrode, a collector electrode, and a base electrode, means providing a signal input path and a first D.-C. path interconnecting the base and collector electrodes of said first transistor, means providing a signal output path and a second D.-C. path interconnecting the collector and emitter electrodes of said second transistor, an interstage network including a third D.-C. path interconnecting the emitter electrode of said first transistor and the base electrode of said second transistor and a fourth D.-C. path interconnecting the collector electrode of said first transistor and the emitter electrode of said second transistor, and means to supply direct operating potentials to both of said transistors simultaneously from a minimum number of D.-C. sources which comprises a first source of direct potential poled to bias the collector electrode of said first transistor in the reverse direction connected between the base and collector electrodes of said first transistor in said first D.-C. path and a second source of direct potential poled to bias the emitter electrode of said second transistor in the forward direction connected between the emitter electrode of said second transistor and the collector electrode of said first transistor in the portion of said fourth D.-C. path common to said second D.-C. path, the magnitude of the potential provided by said second source being greater than that provided by said first source, whereby the emitter electrode of said first transistor is also biased in the forward direction and the collector electrode of said second transistor is also biased in the reverse direction.

2. A cascade amplifier which comprises first and second transistors of like conductivity type each having a semiconductive body and an emitter electrode, a collector electrode, and a base electrode, means providing a signal input path and a first D.-C. path interconnecting the base and collector electrodes of said first transistor, means providing a signal output path and a second D.-C. path interconnecting the collector and emitter electrodes of said second transistor, an interstage network including a third D.-C. path interconnecting the emitter electrode of said first transistor and the base electrode of said second transistor and a fourth D.-C. path interconnecting the collector electrode of said first transistor and the emitter electrode of said second transistor, whereby a net phase reversal at signal frequencies exists between the base electrode of said first transistor and the collector electrode of said second transistor, a negative feedback path interconnecting the base electrode of said first transistor and the collector electrode of said second transistor, and means to supply direct operating potentials to both of said transistors simultaneously from a minimum number of D.-C. sources which comprises a first source of direct potential poled to bias the collector electrode of said first transistor in the reverse direction connected between the base and collector electrodes of said first transistor in said first D.-C. path and a second source of direct potential poled to bias the emitter electrode of said second transistor in the forward direction connected between the emitter electrode of said second transistor and the collector electrode of said first transistor in the portion of said fourth D.-C. path common to said second D.-C. path, the magnitude of the potential provided by said second source being greater than that provided by said first source, whereby the emitter electrode of said first transistor is also biased in the forward direction and the collector electrode of said second transistor is also biased in the reverse direction.

3. A cascade amplifier which comprises first and second transistors of like conductivity type each having a semiconductive body and an emitter electrode, a collector electrode, and a base electrode, means providing a signal input path and a first D.-C. path interconnecting the base and collector electrodes of said first transistor, means providing a signal output path and a second D.-C. path interconnecting the collector and emitter electrodes of said second transistor, an interstage network including a third D.-C. path which is substantially lossless interconnecting the emitter electrode of said first transistor and the base electrode of said second transistor and a fourth D.-C. path interconnecting the collector electrode of said first transistor and the emitter electrode of said second transistor, and means to supply direct operating potentials to both of said transistors simultaneously from a minimum number of D.-C. sources which comprises a first source of direct potential poled to bias the collector electrode of said first transistor in the reverse direction connected between the base and collector electrodes of said first transistor in said first D.-C. path, a first resistance and a second source of direct potential poled to bias the emitter electrode of said second transistor in the forward direction connected in series between the emitter electrode of said second transistor and the collector electrode of said first transistor in the portion of said fourth D.-C. path common to said second D.-C. path, and a second resistance connected between the emitter electrode of said first transistor and a point between said first resistance and said second source, the magnitude of the potential provided by said second source being greater than that provided by said first source, whereby the emitter electrode of said first transistor is also biased in the forward direction, the collector electrode of said second transistor is also biased in the reverse direction, and both of said transistors maintain substantially constant emitter currents.

4. A cascade amplifier in accordance with claim 3 which includes a signal bypass capacitor connected between the emitter electrode of said second transistor and the collector electrode of said first transistor in said signal output path to prevent local feedback from decreasing the gain of said second transistor, whereby said signal output path is also decoupled from said second source without any loss of D.-C. power other than that already devoted to supplying direct operating potentials to said transistors.

5. A cascade amplifier which comprises first and second transistors each having a semiconductive body and an emitter electrode, a collector electrode, and a base electrode, said first transistor comprising a stage of the common-collector configuration and said second transistor comprising a stage of the common-emitter configuration, input means to supply signal energy to the base electrode of said first transistor, output means to withdraw amplified signal energy from the collector electrode of said second transistor, a signal-carrying D.-C. path interconnecting the emitter electrode of said first transistor and the base electrode of said second transistor, and means to supply direct operating potentials to the emitter and collector electrodes of both of said transistors from a minimum number of D.-C. sources which consists substantially of a first source of direct potential connected to bias the collector electrode of said first transistor in the reverse direction and a second source of direct potential connected to bias the emitter electrode of said second transistor in the forward direction, said second source also cooperating with said first source to bias the emitter electrode of said first transistor in the forward direction and to bias the collector electrode of said second transistor in the reverse direction.

6. A cascade amplifier which comprises first and second transistors each having a semiconductive body and an emitter electrode, a collector electrode, and a base electrode, said first transistor comprising a stage of the common-collector configuration and said second transistor comprising a stage of the common-emitter configuration, input means to supply signal energy to the base electrode of said first transistor, output means to withdraw amplified signal energy from the collector electrode of said second transistor, and a substantially lossless signal-carrying D.-C. path interconnecting the emitter electrode of said first transistor and the base electrode of said second transistor.

7. A cascade amplifier which comprises first and second transistors of like conductivity type each having a semiconductive body and an emitter electrode, a collector electrode, and a base electrode, means providing a signal input path and a first D.-C. path interconnecting the base and collector electrodes of said first transistor, means providing a signal output path and a second D.-C. path interconnecting the collector and emitter electrodes of said second transistor, an interstage network including a third D.-C. path interconnecting the emitter electrode of said first transistor and the base electrode of said second transistor and a fourth D.-C. path interconnecting the collector electrode of said first transistor and the emitter electrode of said second transistor, and means to supply direct operating potentials to both of said transistors simultaneously from a minimum number of D.-C. sources which comprises a pair of resistances connected in series between the emitter and collector electrodes of said second transistor in the portion of said fourth D.-C. path common to said second D.-C. path and a D.-C. power supply poled to bias the emitter electrode of said second transistor in the forward direction connected in parallel with said resistances, one of said resistances also being common to said first D.-C. path, whereby not only is the emitter electrode of said second transistor biased in the forward direction but the emitter electrode of said first transistor is also biased in the forward direction and the collector electrodes of both of said transistors are biased in the reverse direction.

8. A cascade amplifier in accordance with claim 7 in which the one of said resistances common to said first D.-C. path is the one electrically nearest the collector electrode of said second transistor in said second D.-C. path.

References Cited in the file of this patent

UNITED STATES PATENTS

| | | |
|---|---|---|
| 2,505,024 | Wintle | Apr. 25, 1950 |
| 2,647,958 | Barney | Aug. 4, 1953 |

OTHER REFERENCES

"The Transistor," p. 367, a text pub. 1951 by Bell Tel. Labs. Inc.

Shea test, "Principles of Transistor Circuits," pages 81, 82, 170, and 351, pub. 1953.

"Electronics" magazine, January 1954, article by Coblenz et al., pages 158–161.